(12) United States Patent
Harada et al.

(10) Patent No.: US 12,199,162 B2
(45) Date of Patent: Jan. 14, 2025

(54) SEMICONDUCTOR DEVICE AND FABRICATION METHOD OF SEMICONDUCTOR DEVICE HAVING IMPROVED BREAKING WITHSTAND CAPABILITY

(71) Applicant: FUJI ELECTRIC CO., LTD., Kanagawa (JP)

(72) Inventors: Yuichi Harada, Matsumoto (JP); Seiji Noguchi, Matsumoto (JP); Norihiro Komiyama, Matsumoto (JP); Yoshihiro Ikura, Matsumoto (JP); Yosuke Sakurai, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 387 days.

(21) Appl. No.: 17/700,534

(22) Filed: Mar. 22, 2022

(65) Prior Publication Data

US 2022/0216314 A1 Jul. 7, 2022

Related U.S. Application Data

(63) Continuation of application No. PCT/JP2021/008891, filed on Mar. 8, 2021.

(30) Foreign Application Priority Data

Apr. 16, 2020 (JP) ................................. 2020-073309

(51) Int. Cl.
*H01L 29/423* (2006.01)
*H01L 29/06* (2006.01)
(Continued)

(52) U.S. Cl.
CPC ...... *H01L 29/4236* (2013.01); *H01L 29/0696* (2013.01); *H01L 29/0804* (2013.01);
(Continued)

(58) Field of Classification Search
None
See application file for complete search history.

(56) References Cited

U.S. PATENT DOCUMENTS

2008/0150018 A1* 6/2008 Tanabe .............. H01L 29/41766
257/330
2009/0242976 A1* 10/2009 Hino ................... H01L 29/7813
257/330
(Continued)

FOREIGN PATENT DOCUMENTS

JP 2008160039 A 7/2008
JP 2009246225 A 10/2009
(Continued)

OTHER PUBLICATIONS

International Search Report and (ISA/237) Written Opinion of the International Search Authority for International Patent Application No. PCT/JP2021/008891, issued/mailed by the Japan Patent Office on May 11, 2021.

*Primary Examiner* — Nduka E Ojeh

(57) ABSTRACT

There is provided a semiconductor device including: a drift region of a first conductivity type disposed in a semiconductor substrate; a base region of a second conductivity type disposed above the drift region; an emitter region of the first conductivity type disposed above the base region; a plurality of trench portions arrayed in a predetermined array direction on a front surface side of the semiconductor substrate; a trench contact disposed on the front surface side of the semiconductor substrate between two adjacent trench portions; and a contact layer of the second conductivity type disposed under the trench contact and having a higher doping concentration than the base region, wherein a lower end of the trench contact is deeper than a lower end of the (Continued)

emitter region, and the emitter region and the contact layer are in contact with each other at a side wall of the trench contact.

15 Claims, 13 Drawing Sheets

(51) Int. Cl.
  *H01L 29/08* (2006.01)
  *H01L 29/417* (2006.01)
  *H01L 29/66* (2006.01)
  *H01L 29/739* (2006.01)
(52) U.S. Cl.
  CPC ............. *H01L 29/41708* (2013.01); *H01L 29/66348* (2013.01); *H01L 29/7397* (2013.01)

(56) References Cited

U.S. PATENT DOCUMENTS

| | | | |
|---|---|---|---|
| 2013/0069146 A1 | 3/2013 | Okumura | |
| 2015/0372090 A1* | 12/2015 | Oosawa | H01L 29/66734 438/270 |
| 2018/0350910 A1 | 12/2018 | Saito | |
| 2018/0366548 A1* | 12/2018 | Naito | H01L 21/266 |
| 2019/0051739 A1* | 2/2019 | Naito | H01L 29/36 |

FOREIGN PATENT DOCUMENTS

| | | |
|---|---|---|
| JP | 2013065724 A | 4/2013 |
| JP | 2014158013 A | 8/2014 |
| JP | 2018206842 A | 12/2018 |
| WO | 2018052099 A1 | 3/2018 |

* cited by examiner

SEMICONDUCTOR DEVICE AND FABRICATION METHOD OF SEMICONDUCTOR DEVICE HAVING IMPROVED BREAKING WITHSTAND CAPABILITY

The contents of the following Japanese patent application(s) are incorporated herein by reference:
No. 2020-073309 filed in JP on Apr. 16, 2020, and
No. PCT/JP2021/008891 in WO on Mar. 8, 2021.

BACKGROUND

1. Technical Field

The present invention relates to a semiconductor device and a fabrication method of the semiconductor device.

2. Related Art

Conventionally, there has been known a semiconductor device including trench contacts (see, for example, patent documents 1 to 3).

Patent document 1: Japanese patent application publication No. 2014-158013.
Patent document 2: Japanese patent application publication No. 2013-065724.
Patent document 3: International publication No. 2018/052099.

DESCRIPTION OF EXEMPLARY EMBODIMENTS

Figure 1A:
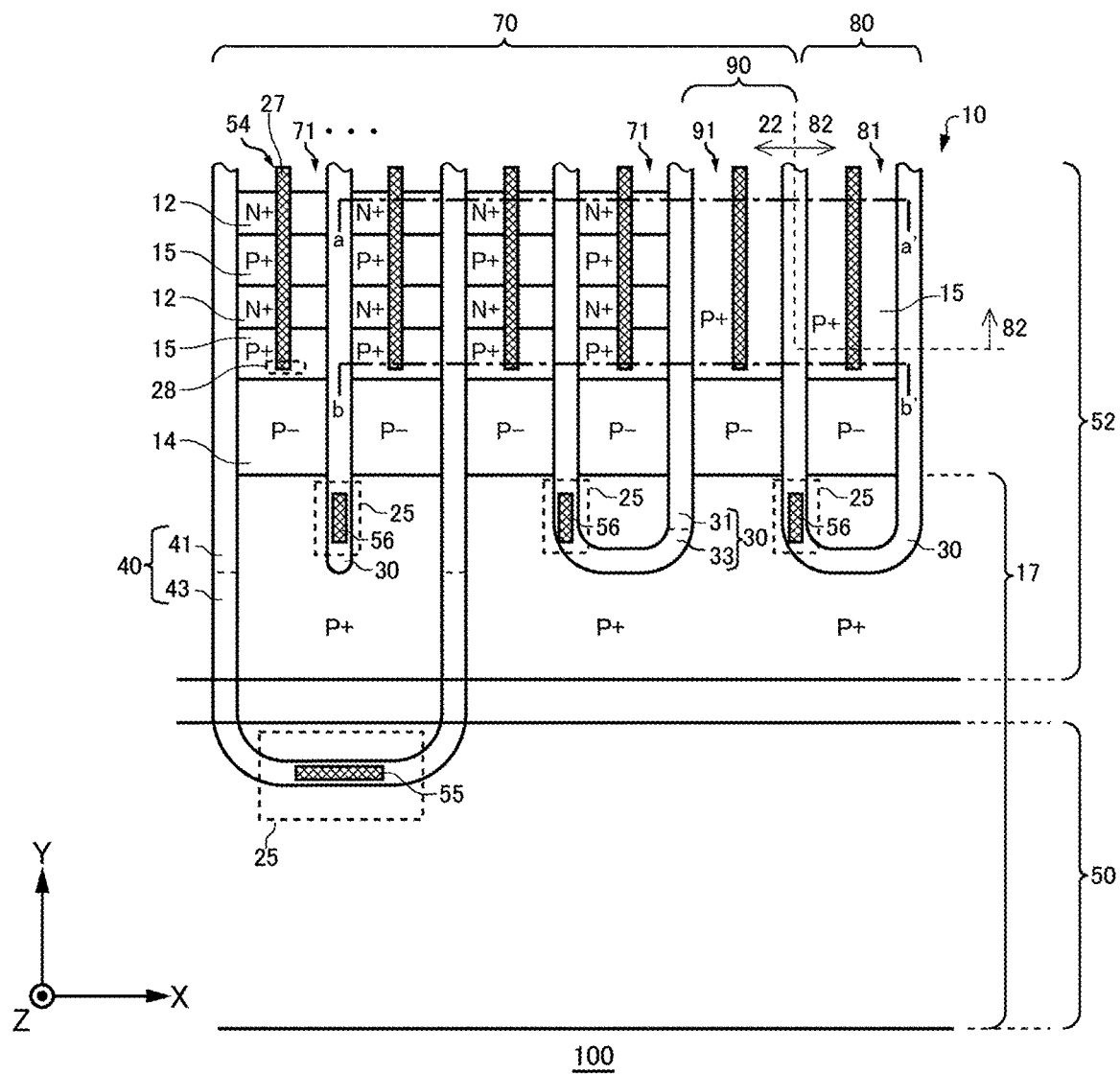
FIG. 1A illustrates an example of a plan view of a semiconductor device 100 according to an example.

Hereinafter, the present invention will be described using embodiments of the invention. The following embodiments are not to limit the present invention according to the appended claims. Besides, all combinations of features described in the embodiments are not necessarily essential to solutions provided by the present invention.

In this specification, one side in a direction parallel to a depth direction of a semiconductor substrate is referred to as "upper," and the other side is referred to as "lower." One of the two main surfaces of a substrate, a layer, or other member is referred to as an upper surface, and the other surface is referred to as a lower surface. Directions of "upper," "lower," "front," and "rear" are not limited by a direction of gravity or a direction of installation to a substrate or the like at the time of packaging a semiconductor device.

In this specification, in some cases, technical matter is described using orthogonal coordinate axes of an X axis, a Y axis, and a Z axis. In this specification, a plane parallel to an upper surface of a semiconductor substrate is referred to as an XY plane, and a depth direction of the semiconductor substrate is referred to as the Z axis. It is noted that in this specification, when the semiconductor substrate is viewed in the Z-axis direction, it is referred to as a plan view.

In each of the examples, an example is shown in which a first conductivity type is the N type whereas a second conductivity type is the P type. However, the first conductivity type may be the P type, and the second conductivity type may be the N type. In this case, conductivity types of a substrate, a layer, a region, and the like in each of the examples are respectively opposite in polarity.

In this specification, a layer and a region that are prefixed with n or p respectively mean that electrons or positive holes are majority carriers in the layer and the region. Moreover, symbols + and − suffixed to n and p respectively mean having a higher doping concentration and a lower doping concentration than a layer and a region without such symbols, and ++ means having a higher doping concentration than + whereas −− means having a lower doping concentration than −.

In this specification, a doping concentration refers to a concentration of dopants that have been turned into donors or acceptors. Therefore, its unit is /cm$^3$. In this specification, in some cases, a concentration difference between donors and acceptors (namely, a net doping concentration) is used as the doping concentration. In this case, the doping concentration may be measured by the srp method. Alternatively, a chemical concentration of donors and acceptors may be used as the doping concentration. In this case, the doping concentration may be measured by the SIMS method. Unless specified otherwise, any of the above may be used as the doping concentration. Unless specified otherwise, a peak value in a doping concentration distribution in a doping region may be used as the doping concentration in this doping region.

Furthermore, in this specification, a dose amount refers to the number of ions implanted to a wafer per unit area when ion implantation is performed. Therefore, its unit is /cm$^2$. It is noted that the dose amount for a semiconductor region may refer to an integral concentration obtained by integrating the doping concentration over a depth direction of the semiconductor region. The unit of the integral concentration is /cm$^2$. Therefore, the dose amount and the integral concentration may be handled as identical matter. The integral concentration may be set at an integral value covering a half-value width, and in the case of overlapping a spectrum of a different semiconductor region, the integral concentration may be derived while an influence from the different semiconductor region is removed.

Consequently, in this specification, a fluctuation of the doping concentration may be read as a fluctuation of the dose amount. That is, a doping concentration in one region is higher than a doping concentration in a different region, it may be construed that a dose amount of the one region is higher than a dose amount of the different region.

FIG. 1A illustrates an example of a plan view of a semiconductor device 100 according to an example. The semiconductor device 100 of this example is a semiconductor chip including a transistor unit 70 and a diode unit 80. For example, the semiconductor device 100 is a reverse conducting IGBT (RC-IGBT). It is noted that the semiconductor device 100 may be an IGBT or a MOS transistor.

The transistor unit 70 is a region where a collector region 22 disposed on a rear surface side of a semiconductor substrate 10 is projected onto an upper surface of the semiconductor substrate 10. The collector region 22 has the second conductivity type. The collector region 22 of this example is of a P+ type as an example. The transistor unit 70 includes a transistor such as an IGBT. The transistor unit 70 includes a border part 90 located on a border between the transistor unit 70 and the diode unit 80.

The diode unit 80 is a region where a cathode region 82 disposed on the rear surface side of the semiconductor substrate 10 is projected onto the upper surface of the semiconductor substrate 10. The cathode region 82 has the first conductivity type. The cathode region 82 of this example is of an N+ type as an example. The diode unit 80 includes a diode such as a free wheel diode (FWD) disposed on the upper surface of the semiconductor substrate 10 and adjacent to the transistor unit 70.

In FIG. 1A, a region in the vicinity of a chip end on an edge side of the semiconductor device 100 is illustrated, and other regions are omitted. For example, an edge termination structure portion may be disposed in a region of the semiconductor device 100 of this example on a negative side in the Y-axis direction. The edge termination structure portion reduces an electric field strength on the upper surface side of the semiconductor substrate 10. The edge termination structure portion includes, for example, a guard ring, a field plate, a RESURF, and a structure where these are combined. It is noted that although in this example, the edge on the negative side in the Y-axis direction is described for convenience, the same applies to the other edge of the semiconductor device 100.

The semiconductor substrate 10 may be a silicon substrate, or a silicon carbide substrate, or a nitride semiconductor substrate, for example, of gallium nitride, or the like. The semiconductor substrate 10 of this example is a silicon substrate.

The semiconductor device 100 of this example includes, at a front surface 21 of the semiconductor substrate 10, gate trench portions 40, dummy trench portions 30, emitter regions 12, a base region 14, contact regions 15, and a well region 17. The front surface 21 will be described later. Moreover, the semiconductor device 100 of this example includes an emitter electrode 52 and a gate metal layer 50, which are disposed above the front surface 21 of the semiconductor substrate 10.

The emitter electrode 52 is disposed above the gate trench portions 40, the dummy trench portions 30, the emitter regions 12, the base region 14, the contact regions 15, and the well region 17. Meanwhile, the gate metal layer 50 is disposed above the gate trench portions 40 and the well region 17.

The emitter electrode 52 and the gate metal layer 50 are formed of a material containing metal. For example, at least some regions of the emitter electrode 52 may be formed of aluminum, aluminum-silicon alloy, or aluminum-silicon-copper alloy. At least some regions of the gate metal layer 50 may be formed of aluminum, aluminum-silicon alloy, or aluminum-silicon-copper alloy. The emitter electrode 52 and the gate metal layer 50 may include barrier metal formed of titanium, titanium compound, or the like in a layer below the regions formed of aluminum or the like. The emitter electrode 52 and the gate metal layer 50 are disposed apart from each other.

The emitter electrode 52 and the gate metal layer 50 are disposed above the semiconductor substrate 10, with an interlayer dielectric film 38 interposed therebetween. In FIG. 1A, the interlayer dielectric film 38 is omitted. Contact holes 54, contact holes 55, and contact holes 56 are disposed to extend through the interlayer dielectric film 38.

Each of the contact holes 55 connects the gate metal layer 50 and a gate conductor in the transistor unit 70 to each other. A plug formed of tungsten or the like may be formed inside the contact hole 55.

Each of the contact holes 56 connects the emitter electrode 52 and a dummy conductor in the dummy trench portion 30 to each other. A plug formed of tungsten or the like may be formed inside the contact hole 56.

Connectors 25 electrically connect a front surface side electrode, such as the emitter electrode 52 or the gate metal layer 50, and the semiconductor substrate 10 to each other. In one example, the connectors 25 are disposed between the gate metal layer 50 and the gate conductor. The connectors 25 are also disposed between the emitter electrode 52 and the dummy conductor. The connectors 25 are of a conductive material such as polysilicon doped with impurities. In this case, the connectors 25 are of polysilicon (N+) doped with N-type impurities. The connectors 25 are disposed above the front surface 21 of the semiconductor substrate 10, with an insulating film such as an oxide film interposed between the connectors 25 and the front surface 21.

The gate trench portions 40 are arrayed at predetermined intervals along a predetermined array direction (the X-axis direction in this example). Each of the gate trench portions 40 of this example may include two extending sections 41 extending along an extending direction (the Y-axis direction in this example) parallel to the front surface 21 of the semiconductor substrate 10 and perpendicular to the array direction, and a connecting section 43 connecting the two extending sections 41.

Preferably, at least part of the connecting section 43 is formed to have a curved shape. Ends of the two extending sections 41 of the gate trench portion 40 are connected so that an electric field strength at the ends of the extending sections 41 can be reduced. At the connecting section 43 of the gate trench portion 40, the gate metal layer 50 may be connected to the gate conductor.

The dummy trench portions 30 are trench portions electrically connected to the emitter electrode 52. In a similar manner to the gate trench portions 40, the dummy trench portions 30 are arrayed at predetermined intervals along a predetermined array direction (the X-axis direction in this example). In a similar manner to the gate trench portions 40, the dummy trench portions 30 of this example may have a U shape at the front surface 21 of the semiconductor substrate 10. That is, each of the dummy trench portions 30 may include two extending sections 31 extending along the extending direction and a connecting section 33 connecting the two extending sections 31.

The transistor unit 70 of this example has a configuration where the two gate trench portions 40 and the three dummy trench portions 30 are repeatedly arrayed. That is, the transistor unit 70 of this example includes the gate trench portions 40 and the dummy trench portions 30 at a ratio of 2:3. For example, the transistor unit 70 includes one extending sections 31 between two extending sections 41. Furthermore, the transistor unit 70 includes two extending sections 31 adjacent to the gate trench portion 40.

However, the ratio of the gate trench portions 40 and the dummy trench portions 30 is not limited to this example. The ratio of the gate trench portions 40 and the dummy trench portions 30 may be 1:1 or 2:4. Alternatively, the transistor unit 70 may have a so-called full gate structure where no dummy trench portions 30 are provided but only the gate trench portions 40 are provided.

The well region 17 is a region of the second conductivity type disposed closer to the front surface 21 side of the semiconductor substrate 10 than a drift region 18, described later, is. The well region 17 is an example of a well region disposed on the edge side of the semiconductor device 100. The well region 17 is of the P+ type as an example. The well region 17 is formed in a predetermined range from an end of an active region on a side where the gate metal layer 50 is disposed. A diffusion depth of the well region 17 may be greater than depths of the gate trench portions 40 and the dummy trench portions 30. Some regions of the gate trench portions 40 and the dummy trench portions 30 on the gate metal layer 50 side are formed in the well region 17. End bottoms of the gate trench portions 40 and the dummy trench portions 30 in the extending direction may be covered with the well region 17.

In the transistor unit 70, the contact hole 54 is formed above each of the emitter regions 12 and the contact regions 15. Moreover, in the diode unit 80, the contact hole 54 is disposed above the contact region 15. In the border part 90, the contact hole 54 is disposed above the contact region 15. In the diode unit 80, the contact hole 54 is disposed above the base region 14. None of the contact holes 54 are disposed above the well regions 17 disposed on both ends in the Y-axis direction. In this manner, one or more contact holes 54 are formed in the interlayer dielectric film. The one or more contact holes 54 may be disposed to extend in the extending direction.

Trench contacts 27 electrically connect the emitter electrode 52 and the semiconductor substrate 10 to each other. The trench contacts 27 are disposed in the contact holes 54. The trench contacts 27 are disposed to extend in the extending direction.

A terminal end 28 is an end of each of the trench contacts 27 in the extending direction. The terminal end 28 is disposed at a region in which the contact region 15 is formed on the front surface 21 in a mesa portion 71. The terminal end 28 may be disposed at a region in which to the contact region 15 is formed on the front surface 21 in a mesa portion 81 or a mesa portion 91.

The border part 90 is disposed in the transistor unit 70 and is a region adjacent to the diode unit 80. The border part 90 includes the contact region 15. The border part 90 of this example does not include the emitter region 12. In one example, a trench portion of the border part 90 is the dummy trench portion 30. The border part 90 of this example is arranged to have the dummy trench portions 30 on both ends in the X-axis direction.

The mesa portion 71, the mesa portion 91, and the mesa portion 81 are mesa portions disposed adjacent to the trench portions in a plane parallel to the front surface 21 of the semiconductor substrate 10. The mesa portion may be a portion of the semiconductor substrate 10 interposed between two adjacent trench portions and may be a portion extending from the front surface 21 of the semiconductor substrate 10 to a depth of the deepest bottom of each of the trench portions. An extending section of each of the trench portions may be regarded as a single trench portion. That is, a region interposed between two extending sections may be regarded as a mesa portion.

In the transistor unit 70, the mesa portion 71 is disposed adjacent to at least one of the dummy trench portions 30 or the gate trench portions 40. At the front surface 21 of the semiconductor substrate 10, the mesa portion 71 includes the well region 17, the emitter regions 12, the base region 14, and the contact regions 15. In the mesa portion 71, the emitter regions 12 and the contact regions 15 are disposed alternately in the extending direction.

The mesa portion 91 is disposed in the border part 90. At the front surface 21 of the semiconductor substrate 10, the mesa portion 91 includes the contact regions 15. The mesa portion 91 of this example includes the base region 14 and the well region 17 on the negative side in the Y-axis direction.

In the diode unit 80, the mesa portion 81 is disposed in a region interposed between adjacent dummy trench portions 30. At the front surface 21 of the semiconductor substrate 10, the mesa portion 81 includes the contact regions 15. The mesa portion 81 of this example includes the base region 14 and the well region 17 on the negative side in the Y-axis direction.

In the transistor unit 70 and the diode unit 80, the base region 14 is a region of the second conductivity type disposed on the front surface 21 side of the semiconductor substrate 10. The base region 14 is of a P− type as an example. At the front surface 21 of the semiconductor substrate 10, the base regions 14 may be disposed on both ends of the mesa portions 71 and the mesa portion 91 in the Y-axis direction. It is noted that FIG. 1A illustrates only one of the ends of the base region 14 in the Y-axis direction.

The emitter regions 12 are regions of the first conductivity type having a higher doping concentration than the drift region 18. The emitter regions 12 of this example are of the N+ type as an example. An example of dopants of the emitter regions 12 is arsenic (As). At the front surface 21 of the mesa portion 71, the emitter regions 12 are disposed in contact with the gate trench portion 40. The emitter regions 12 may be disposed to extend in the X-axis direction from one of the two trench portions between which the mesa portion 71 is interposed to the other. The emitter regions 12 are also disposed under the contact holes 54.

The emitter regions 12 may or may not be in contact with the dummy trench portions 30. The emitter regions 12 of this example are in contact with the dummy trench portions 30. The emitter regions 12 may not necessarily be disposed in the mesa portion 81 and the mesa portion 91.

The contact regions 15 are regions of the second conductivity type having a higher doping concentration than the base region 14. The contact regions 15 of this example are of the P+ type as an example. The contact regions 15 of this example are disposed at the front surface 21 of the mesa portions 71, the mesa portion 81, and the mesa portion 91. The contact regions 15 may be disposed in the X-axis direction from one of the two trench portions between which the mesa portion 71, the mesa portion 81, or the mesa portion 91 is interposed to the other. The contact regions 15 may or may not be in contact with the gate trench portions 40. The contact regions 15 may or may not be in contact with the dummy trench portions 30. In this example, the contact regions 15 are in contact with the dummy trench portions 30 and the gate trench portions 40. The contact regions 15 are also disposed under the contact holes 54.

Figure 1B:
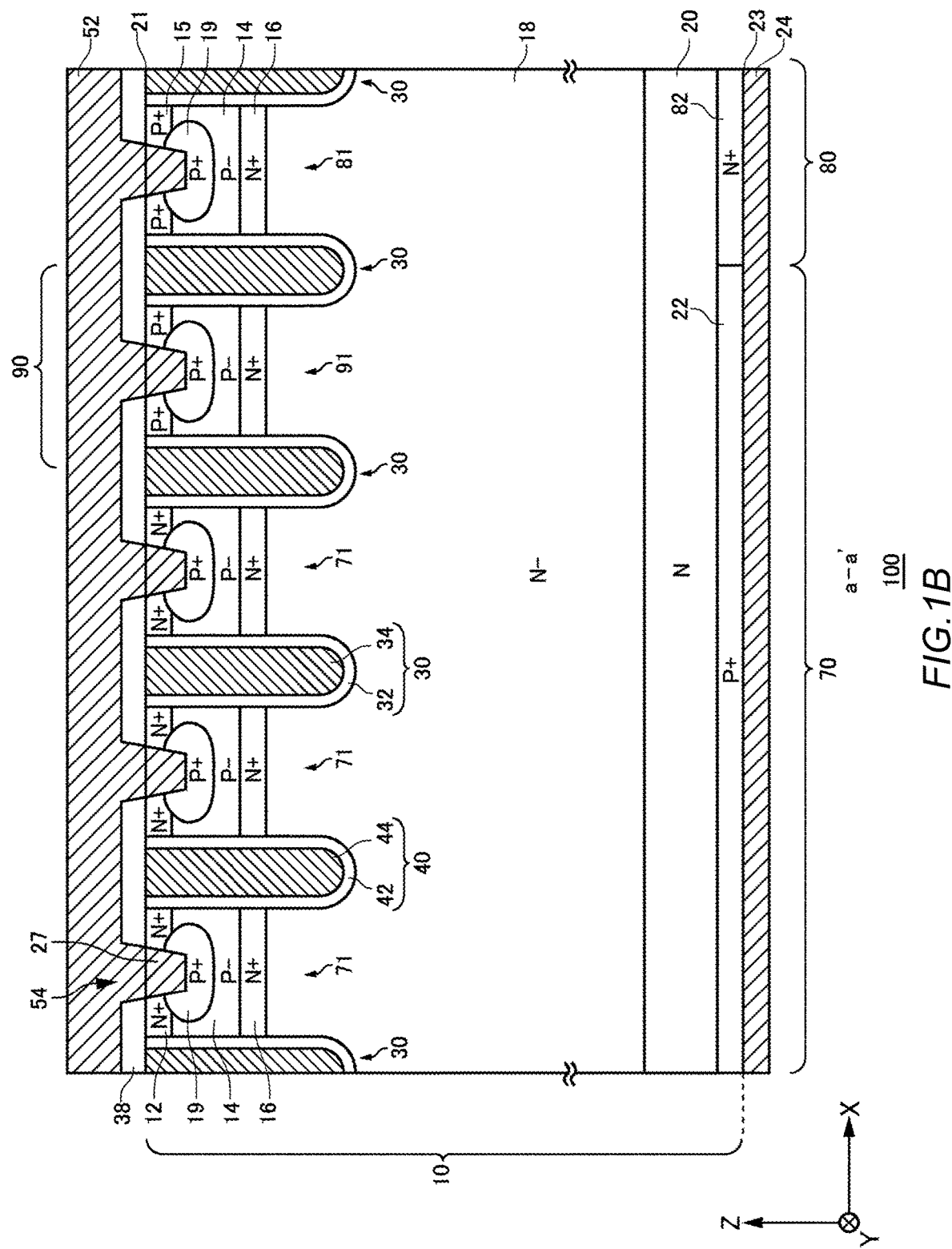
FIG. 1B is a diagram illustrating an example of an a-a' cross section of FIG. 1A.

FIG. 1B is a diagram illustrating an example of an a-a' cross section of FIG. 1A. The a-a' cross section is an XZ plane passing through the emitter regions 12 in the transistor unit 70. In the a-a' cross section, the semiconductor device 100 of this example includes the semiconductor substrate 10, the interlayer dielectric film 38, the emitter electrode 52, and a collector electrode 24. The emitter electrode 52 is formed above the semiconductor substrate 10 and the interlayer dielectric film 38.

The drift region 18 is a region of the first conductivity type disposed in the semiconductor substrate 10. The drift region 18 of this example is of the N− type as an example. The drift region 18 may be a remaining region in the semiconductor substrate 10 where no other doping regions are formed. That is, a doping concentration of the drift region 18 may be a doping concentration of the semiconductor substrate 10.

A buffer region 20 is a region of the first conductivity type disposed under the drift region 18. The buffer region 20 of this example is of the N type as an example. A doping concentration of the buffer region 20 is higher than the doping concentration of the drift region 18. The buffer region 20 may function as a field stop layer configured to prevent a depletion layer spread from a lower surface side of the base region 14 from reaching the collector region 22 of the second conductivity type and the cathode region 82 of the first conductivity type.

In the transistor unit 70, the collector region 22 is disposed under the buffer region 20. In the diode unit 80, the cathode region 82 is disposed under the buffer region 20. A border between the collector region 22 and the cathode region 82 is a border between the transistor unit 70 and the diode unit 80.

The collector electrode 24 is formed on a rear surface 23 of the semiconductor substrate 10. The collector electrode 24 is formed of a conductive material such as metal.

In the mesa portions 71, the mesa portion 91, and the mesa portion 81, the base region 14 is a region of the second conductivity type disposed above the drift region 18. The base region 14 is disposed in contact with the gate trench portions 40. The base region 14 may be disposed in contact with the dummy trench portions 30.

The emitter regions 12 are interposed between the base region 14 and the front surface 21. The emitter regions 12 of this example are disposed in the mesa portions 71 and not disposed in the masa portion 81 and the mesa portion 91. The emitter regions 12 are disposed in contact with the gate trench portions 40. The emitter regions 12 may be or may not be disposed in contact with the dummy trench portions 30.

In the mesa portion 81 and the mesa portion 91, each of the contact regions 15 is disposed above the base region 14. In the mesa portion 81 and the mesa portion 91, the contact region 15 is disposed in contact with the dummy trench portions 30. In another cross section, the contact region 15 may be disposed on the front surface 21 of the mesa portions 71.

Each of the trench contacts 27 has a conductive material filled in the contact hole 54. The trench contact 27 is interposed between two adjacent trench portions among the plurality of trench portions. On the front surface 21 side, the trench contact 27 is disposed in contact with a contact layer 19. The trench contact 27 of this example is disposed from the front surface 21 through the emitter region 12. The trench contact 27 may have the same material as the emitter electrode 52.

A lower end of the trench contact 27 is deeper than a lower end of the emitter region 12. The trench contact 27 is provided to decrease resistance of the base region 14 so as to facilitate extraction of minority carriers (e.g., positive holes). This can improve breaking withstand capability such as a latch-up withstand capability owing to the minority carriers.

The trench contact 27 has a bottom surface of a substantially planar shape. The bottom surface of the trench contact 27 is covered with the contact layer 19. The trench contact 27 of this example has a tapered shape with a side wall inclined. However, the side wall of the trench contact 27 may be disposed substantially perpendicular to the front surface 21.

The contact layer 19 is disposed under the trench contact 27. The contact layer 19 is a region of the second conductivity type having a higher doping concentration than the base region 14. The contact layer 19 of this example is of the P+ type as an example. For example, the contact layer 19 is formed by ion implantation of boron (B) or boron fluoride ($BF_2$). The contact layer 19 may have the same doping concentration as the contact region 15. The contact layer 19 prevents a latch-up by extracting minority carriers.

The contact layer 19 is disposed on the side wall and the bottom surface of the trench contact 27. The contact layer 19 of this example is provided in each of the mesa portions 71, the mesa portion 81, and the mesa portion 91. The contact layer 19 may be disposed to extend in the Y-axis direction.

At the side wall of the trench contact 27, the emitter region 12 and the contact layer 19 are in contact with each other. The side wall of the trench contact 27 of this example is covered with the emitter region 12 and the contact layer 19. That is, the trench contact 27 is not in contact with the base region 14.

In this example, the emitter region 12 and the contact layer 19 are in contact with each other so that injection of carriers from the emitter region 12 can be reduced to improve breaking withstand capability. Moreover, even in the case of running high current in the semiconductor device 100, extraction efficiency of minority carriers can be improved by the contact layer 19 so as to stabilize a potential of the base region 14.

An accumulation region 16 is a region of the first conductivity type disposed closer to the front surface 21 side of the semiconductor substrate 10 than the drift region 18 is. The accumulation region 16 of this example is of the N+ type as an example. The accumulation region 16 is provided in the transistor units 70 and the diode unit 80. However, the accumulation region 16 may not necessarily be provided.

Furthermore, the accumulation region 16 is disposed in contact with the gate trench portion 40. The accumulation region 16 may be or may not be in contact with the dummy trench portions 30. A doping concentration of the accumulation region 16 is higher than the doping concentration of the drift region 18. A dose amount of ion implantation to the accumulation region 16 may be equal to or greater than $1E12$ $cm^{-2}$ and equal to or less than $1E13$ $cm^{-2}$. Alternatively, the dose amount of ion implantation to the accumulation region 16 may be equal to or greater than $3E12$ $cm^{-2}$ and equal to or less than $6E12$ $cm^{-2}$. The accumulation region 16 is provided to enhance a carrier injection enhancement effect (IE effect) so that an on-state voltage of the transistor unit 70 can be decreased. It is noted that E represents a power of 10. For example, $1E12$ $cm^{-2}$ represents $1 \times 10^{12}$ $cm^{-2}$.

One or more gate trench portions 40 and one or more dummy trench portions 30 are disposed in the front surface 21. Each of the trench portions is disposed from the front surface 21 to the drift region 18. In a region where at least one of the emitter region 12, the base region 14, the contact region 15, and the accumulation region 16 is provided, each of the trench portions extends through these regions as well and reaches the drift region 18. The trench portion extending through the doping regions is not limited to the trench portion fabricated in sequence of forming the doping regions and thereafter forming the trench portion. The trench portion extending through the doping regions includes the trench portion fabricated by forming the trench portions and thereafter forming the doping regions between the trench portions.

The gate trench portion 40 includes a gate trench, a gate insulating film 42, and a gate conductor 44, which are formed in the front surface 21. The gate insulating film 42 is formed to cover an inner wall of the gate trench. The gate insulating film 42 may be formed by oxidizing or nitriding semiconductor of the inner wall of the gate trench. The gate conductor 44 is formed on an inner side of the gate insulating film 42 within the gate trench. The gate insulating film 42 insulates the gate conductor 44 and the semiconductor substrate 10 from each other. The gate conductor 44 is formed of a conductive material such as polysilicon. At the front surface 21, the gate trench portion 40 is covered with the interlayer dielectric film 38.

The gate conductor 44 includes a region opposed to the base region 14 adjacent on the mesa portion 71 side in a depth direction of the semiconductor substrate 10, with the gate insulating film 42 interposed therebetween. When a predetermined voltage is applied to the gate conductor 44, an inversion layer of electrons is caused to form a channel on an outermost layer of an interface of the base region 14 in contact with the gate trench.

The dummy trench portion 30 may have the same configuration as the gate trench portion 40. The dummy trench portion 30 includes a dummy trench, a dummy insulating film 32, and a dummy conductor 34, which are formed on the front surface 21 side. The dummy insulating film 32 is formed to cover an inner wall of the dummy trench. The dummy conductor 34 is formed within the dummy trench and at the same time formed on an inner side of the dummy insulating film 32. The dummy insulating film 32 insulates the dummy conductor 34 and the semiconductor substrate 10 from each other. At the front surface 21, the dummy trench portion 30 is covered with the interlayer dielectric film 38.

The interlayer dielectric film 38 is disposed on the front surface 21. The emitter electrode 52 is disposed above the interlayer dielectric film 38. One or more contact holes 54 configured to electrically connect the emitter electrode 52 and the semiconductor substrate 10 to each other are disposed in the interlayer dielectric film 38. The contact holes 55 and the contact holes 56 may be similarly disposed to extend through the interlayer dielectric film 38.

Figure 1C:
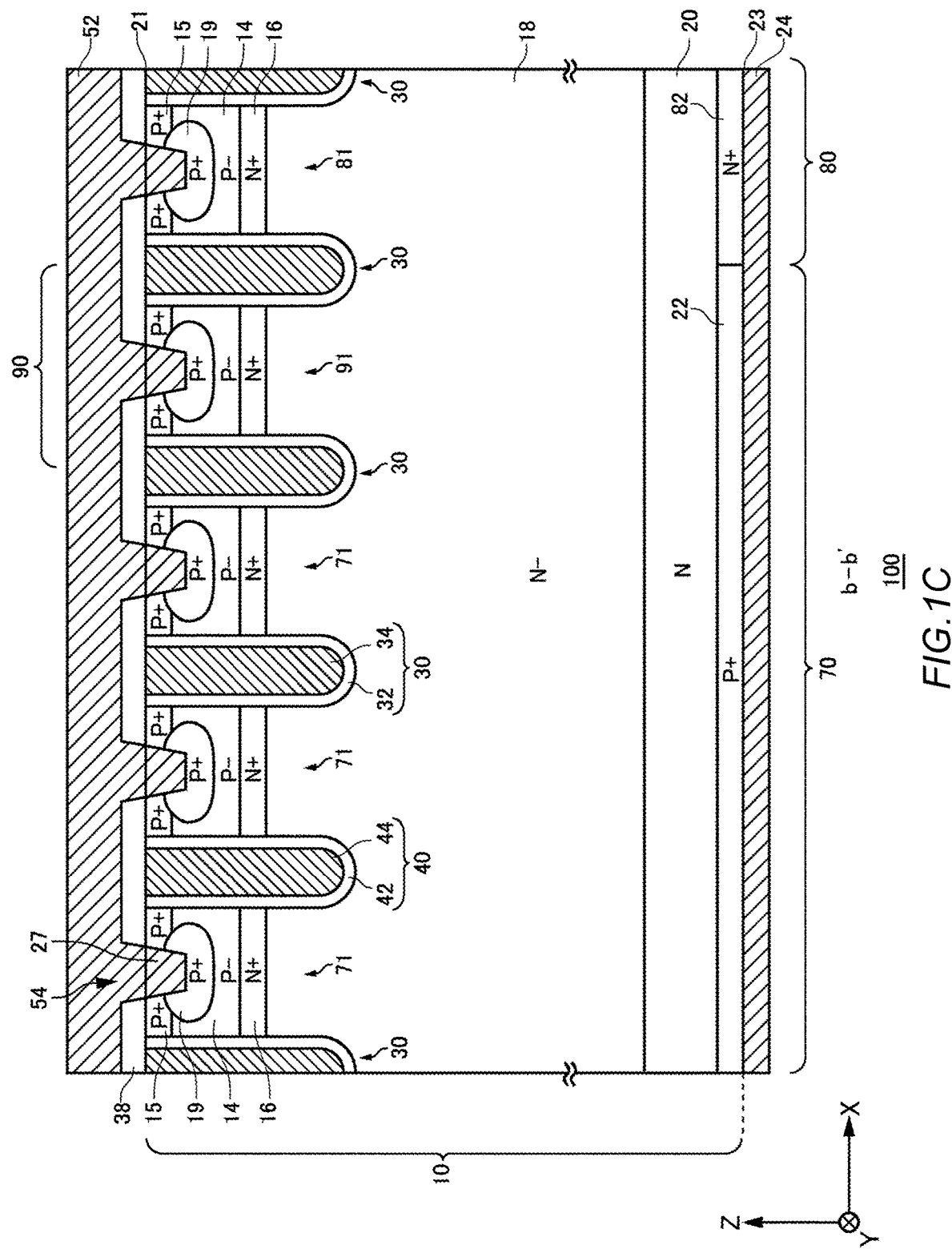
FIG. 1C is a diagram illustrating an example of a b-b' cross section of FIG. 1A.

FIG. 1C is a diagram illustrating an example of a b-b' cross section of FIG. 1A. The b-b' cross section is an XZ plane passing through the contact regions 15 in the transistor unit 70.

In the b-b' cross section, the mesa portion 71 includes the base region 14, the contact region 15, the accumulation region 16, and the contact layer 19. The mesa portion 91 includes the base region 14, the contact region 15, the accumulation region 16, and the contact layer 19 in a manner similar to the case of the a-a' cross section. In the b-b' cross section, the mesa portion 71 has the same configuration as the mesa portion 91. The mesa portion 81 includes the base region 14, the contact region 15, the accumulation region 16, and the contact layer 19 in a manner similar to the case of the a-a' cross section.

Figure 1D:
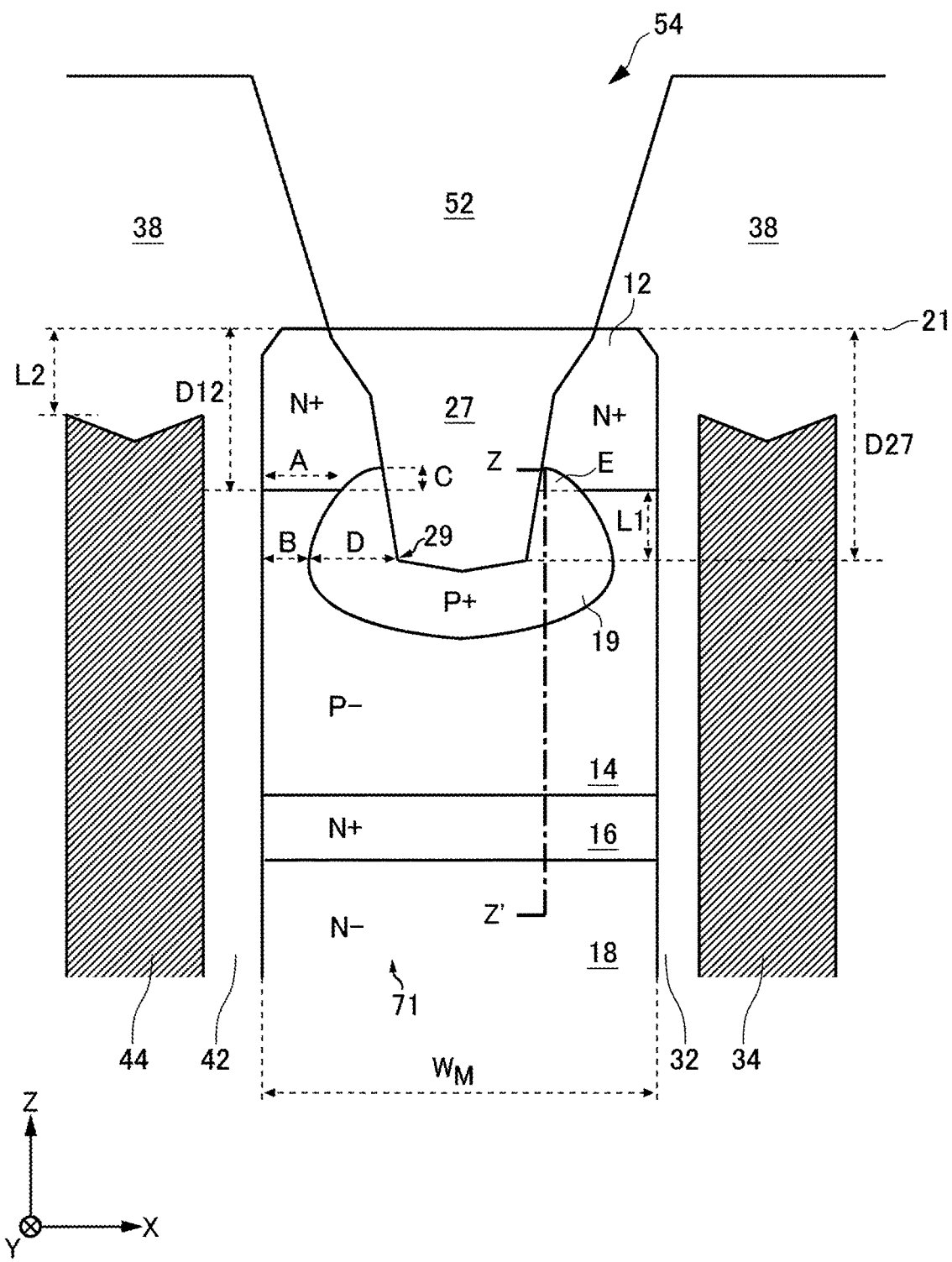
FIG. 1D illustrates an example of an enlarged view of the vicinity of a trench contact 27.

FIG. 1D illustrates an example of an enlarged view of the vicinity of the trench contact 27. In this example, a description will be given using the mesa portion 71 between the dummy trench portion 30 and the gate trench portion 40. However, the mesa portion 81 or the mesa portion 91 may have a similar configuration.

A mesa width $W_M$ is a width of the mesa portion in the X-axis direction. The mesa portion 71, the mesa portion 81, and the mesa portion 91 may have the identical mesa width $W_M$. The mesa width $W_M$ in this example is equal to or greater than 0.8 μm and equal to or less than 1.5 μm.

A length A is a length of contact between the lower end of the emitter region 12 and the base region 14 in the array direction. For example, the length A is greater than 0.1 μm and less than 0.3 μm.

A length B is a shortest distance between the contact layer 19 and an adjacent trench portion among the plurality of trench portions. The contact layer 19 is disposed apart from the adjacent trench portion so as to form a channel. For example, the length B is equal to or greater than 0.1 μm. This can improve breaking withstand capability while avoiding an influence on a gate threshold voltage Vth.

The length A is greater than the length B. That is, the base region 14 where minority carriers pass has a smaller width than a lower surface of the emitter region 12. This facilitates extraction of the minority carriers in the contact layer 19 before the minority carriers move to the vicinity of the emitter region 12.

An extending region E is a region in the contact layer 19 that extends to the front surface 21 side beyond the lower end of the emitter region 12. The extending region E is provided to reliably bring the emitter region 12 and the contact layer 19 into contact with each other. Moreover, the extraction efficiency of the minority carriers is improved to accordingly facilitate prevention of a latch-up.

A length C is a difference between a depth of an upper end of the contact layer 19 and a depth of the lower end of the emitter region 12. That is, the length C indicates an extending amount of the extending region E into the emitter region 12. As the length C is greater, it indicates that the contact layer 19 extends more into the emitter region 12.

A length D is a maximum distance from a side wall bottom 29 of the trench contact 27 to the outer peripheral surface of the contact layer 19 in the array direction. The length D in this example is greater than the length B. That is, the contact layer 19 extends closer to the trench portion than the side wall bottom 29 of the trench contact 27 does. This facilitates guiding of the minority carriers to the contact layer 19 so that an amount of the minority carriers that pass between the contact layer 19 and the trench portion and move to the emitter region 12 can be reduced.

The trench contact 27 has a concave bottom surface recessed to the rear surface 23 side. The concave bottom surface of the trench contact 27 of this example is recessed from the side wall bottom 29 toward the center of the trench contact 27. The bottom surface of the trench contact 27 may be recessed in an arcuate shape. The concave bottom surface of the trench contact 27 is formed by etching for forming the contact hole 54 of the trench contact 27.

A length L1 is a difference between the lower end of the emitter region 12 and the bottom surface of the trench contact 27. As the length L1 is greater, the trench contact 27 is disposed to extend more from the emitter region 12, thus facilitating extraction of the minority carriers. In the semiconductor device 100 of this example, the contact layer 19 is in contact with the emitter region 12 so that even when the length L1 is greater, the carriers can be prevented from being injected from the emitter region 12.

A length L2 is a distance from the front surface 21 to an upper end of the dummy conductor 34 or an upper end of the gate conductor 44. When the dummy conductor 34 or the gate conductor 44 has a recess in the upper end, the length L2 may be a distance from the front surface 21 to an uppermost end of the dummy conductor 34 or the gate conductor 44. For example, the length L2 is equal to or greater than 0.1 μm and equal to or less than 0.4 μm.

A depth D12 is a depth from the front surface 21 to the lower end of the emitter region 12. For example, the depth D12 is equal to or greater than 0.3 μm and equal to or less than 0.7 μm. The depth D12 may be greater than the length L2. That is, the emitter region 12 is disposed to extend from the front surface 21 to a depth opposed to the dummy conductor 34 or the gate conductor 44.

A depth D27 is a depth from the front surface 21 to the bottom surface of the trench contact 27. The depth D27 in this example is a depth from the front surface 21 to a lower end of the side wall of the trench contact 27. The depth D27 is greater than the depth D12. For example, the depth D27 is equal to or greater than 0.5 μm and equal to or less than 1.0 μm.

Figure 1E:
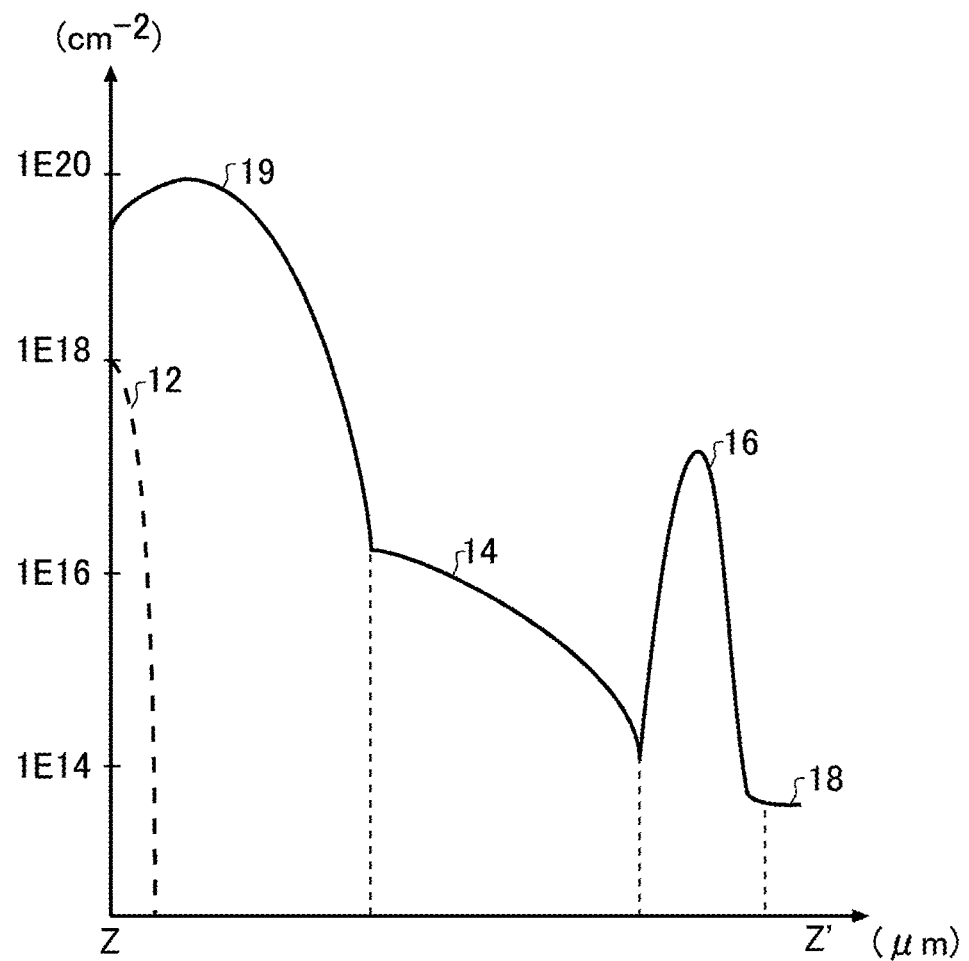
FIG. 1E illustrates an example of a doping concentration distribution in the vicinity of the trench contact 27.

FIG. 1E illustrates an example of a doping concentration distribution in the vicinity of the trench contact 27. The vertical axis represents a doping concentration ($cm^{-2}$), and the horizontal axis represents a distance (μm) from the upper end of the contact layer 19 to the depth direction. The solid line indicates a doping concentration distribution at a Z-Z' position. The dashed line indicates a doping concentration in the emitter region 12 at the same depth as indicated by the solid line.

The contact layer 19 is formed by ion implantation through the trench contact 27. Although the contact layer 19 has a single peak, the contact layer 19 may have a plurality of peaks. A position of the peak of the contact layer 19 may be formed at a position deeper than the lower end of the emitter region 12. The peak of the contact layer 19 of this example is approximately $1E20\ cm^{-2}$.

It is noted that the doping concentration distribution in this example is a mere example. In order to embody the semiconductor device 100 disclosed in the specification of the present application, a level and a depth, for example, of the doping concentration peak may be changed as suited.

Figure 1F:
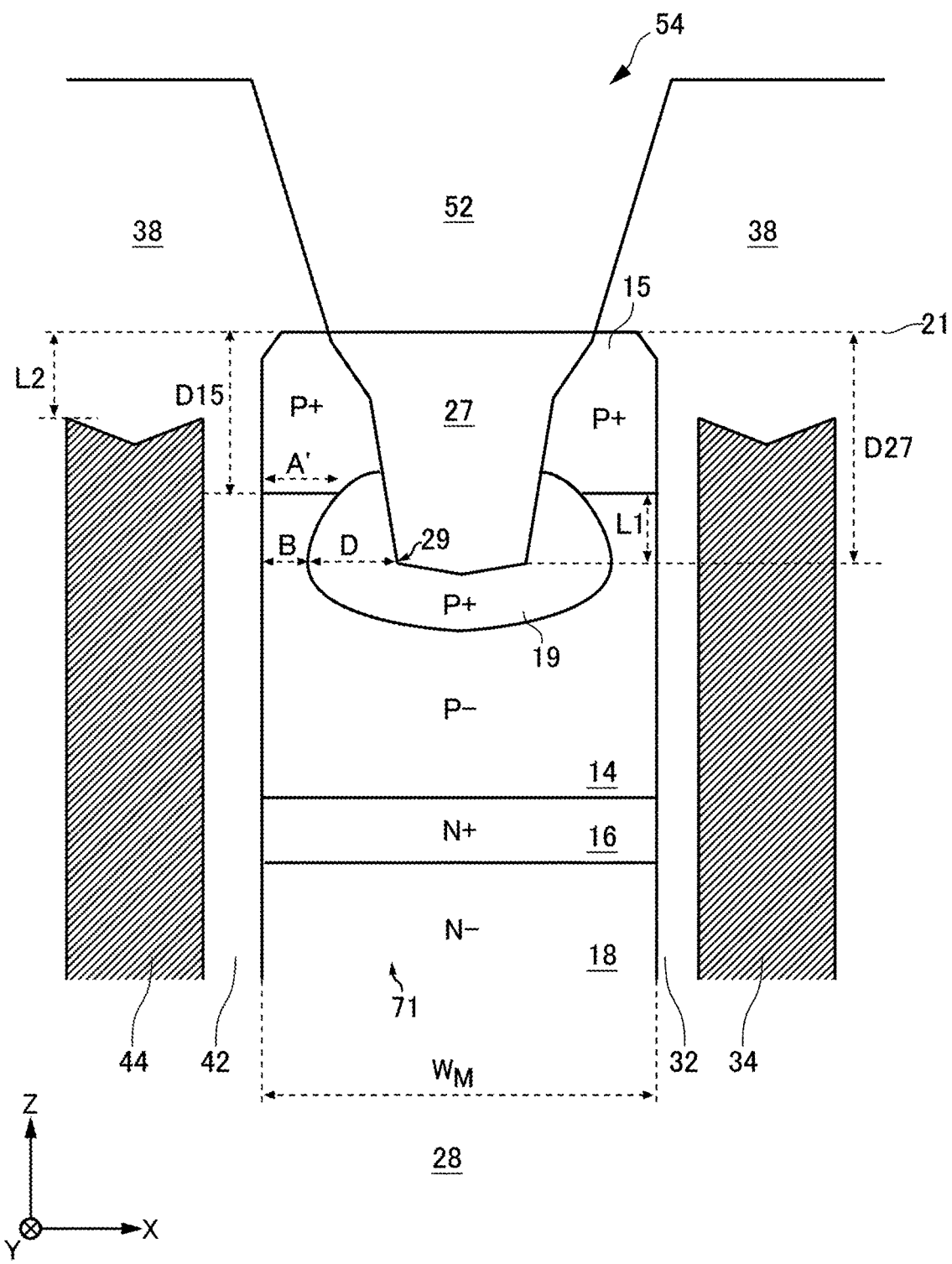
FIG. 1F illustrates an example of an enlarged cross-sectional view of the vicinity of a terminal end 28.

FIG. 1F illustrates an example of an enlarged cross-sectional view of the vicinity of the terminal end 28. This view illustrates an XZ plane passing through the terminal end 28.

A side wall of the terminal end 28 of the trench contact 27 is covered with a region of the second conductivity type. The side wall of the terminal end 28 of the trench contact 27 of this example is covered with the contact region 15 and the contact layer 19. In this manner, the contact layer 19 may be disposed in contact with the emitter region 12 or may be disposed in contact with the contact region 15.

A length A' is a length of contact between a lower end of the contact region 15 and the base region 14 in the array direction. For example, the length A' is greater than 0.1 μm and less than 0.3 μm.

A depth D15 is a depth from the front surface 21 to the lower end of the contact region 15. For example, the depth D15 is equal to or greater than 0.3 μm and equal to or less than 0.7 μm. The depth D15 may be greater than the length L2. Moreover, the depth D15 may be equal to or different from the depth D12 of the emitter region 12.

Figure 2:
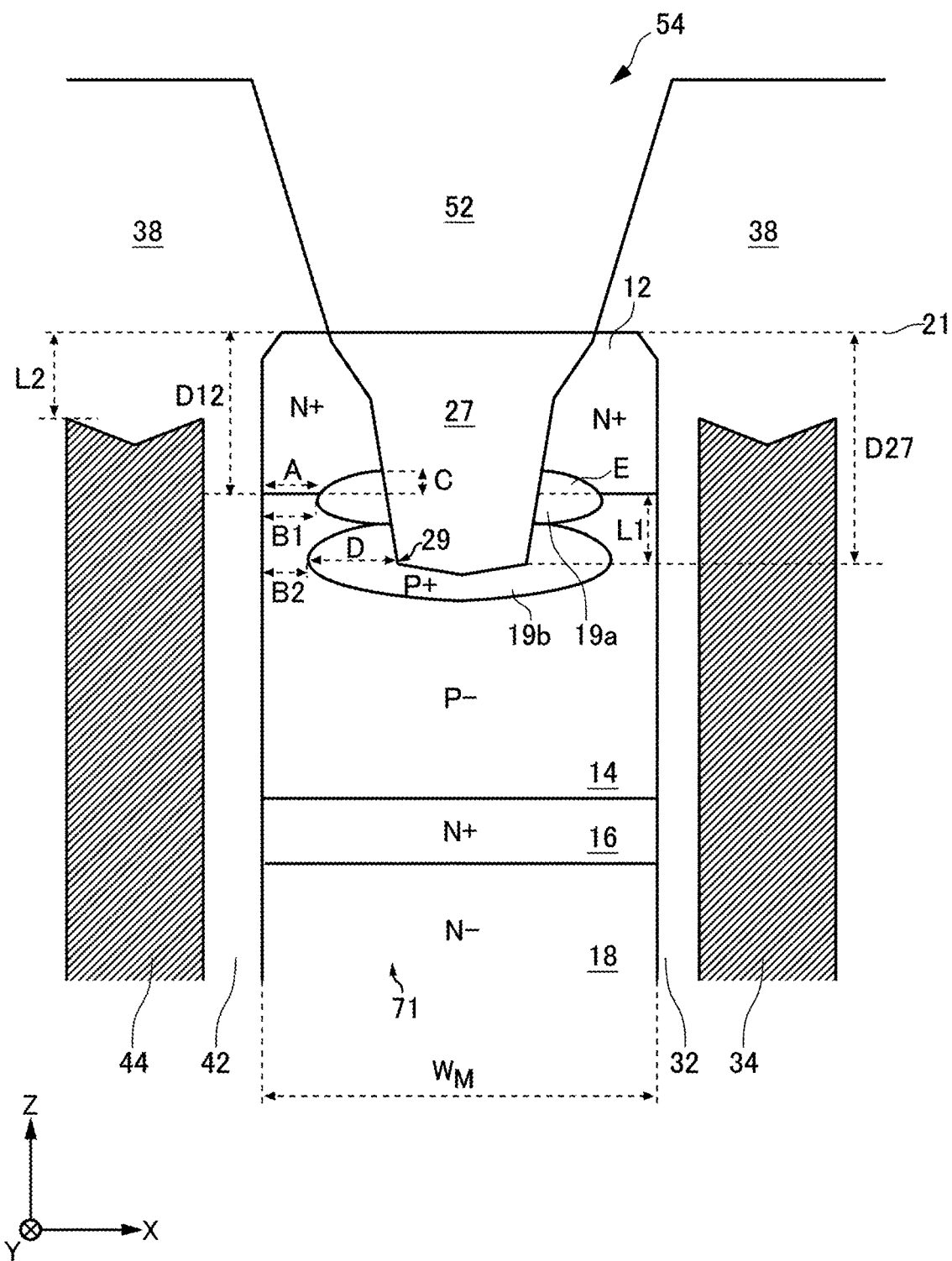
FIG. 2 illustrates an example of an enlarged view of the vicinity of the trench contact 27.

FIG. 2 illustrates an example of an enlarged view of the vicinity of the trench contact 27. The contact layer 19 of this example includes two contact layers, namely, a contact layer 19a and a contact layer 19b. The contact layer 19a is an example of the first contact layer, and the contact layer 19b is an example of the second contact layer.

The contact layer 19a is disposed on the side wall of the trench contact 27. The contact layer 19a is disposed in contact with the emitter region 12. The contact layer 19a includes the extending region E extending toward the front surface 21 beyond the lower end of the emitter region 12. Even when the trench contact 27 is disposed to project from the emitter region 12 to the rear surface 23 side, the contact layer 19a is in contact with the emitter region 12. Consequently, the extraction efficiency of the minority carriers can be improved to prevent a latch-up.

The contact layer 19b is disposed on the side wall of the trench contact 27 and under the contact layer 19a. The contact layer 19b is disposed on the side wall of the trench contact 27 and in contact with the contact layer 19a. That is, the side wall of the trench contact 27 is covered with the emitter region 12, the contact layer 19a, and the contact layer 19b.

A doping concentration of the contact layer 19a may be equal to a doping concentration of the contact layer 19b. Moreover, the doping concentrations of the contact layer 19a and the contact layer 19b may be equal to a doping concentration of the contact region 15. Alternatively, the doping concentration of the contact layer 19a may be lower than the doping concentration of the contact layer 19b.

A length B1 is a shortest distance between the contact layer 19a and an adjacent trench portion among the plurality of trench portions. A length B2 is a shortest distance between the contact layer 19b and an adjacent trench portion among the plurality of trench portions. The length B1 is greater than the length B2. This enables the contact layer 19b to reliably extract the minority carriers.

Figure 3:
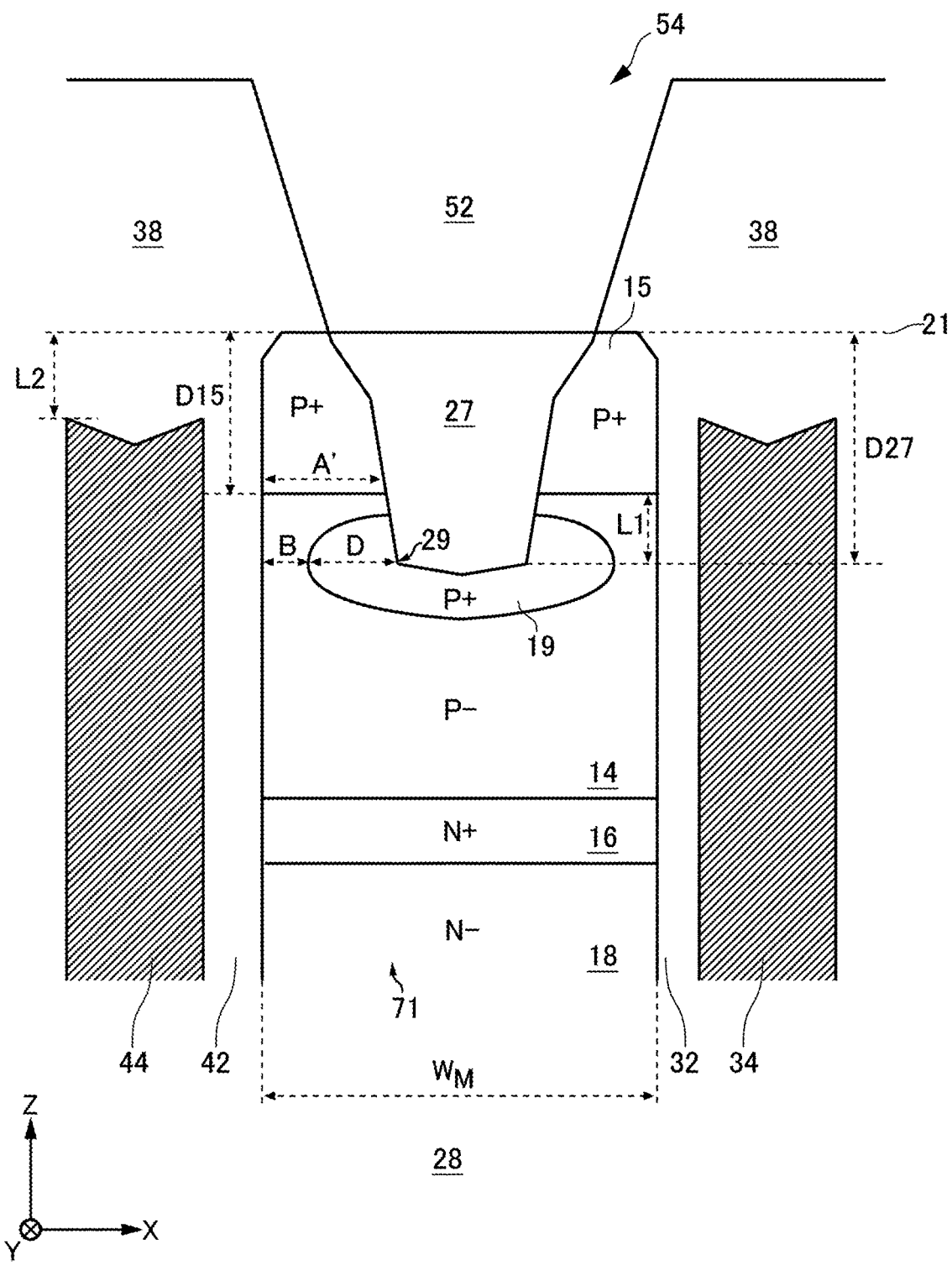
FIG. 3 illustrates an example of an enlarged cross-sectional view of the vicinity of the terminal end 28.

FIG. 3 illustrates an example of an enlarged cross-sectional view of the vicinity of the terminal end 28. This view illustrates an XZ plane passing through the terminal end 28. In this example, a difference from the cross-sectional view of FIG. 1D will be particularly described.

The side wall of the terminal end 28 is covered with a region of the second conductivity type. The contact layer 19 is disposed on the side wall of the terminal end 28 of this example. The side wall of the terminal end 28 is covered with the base region 14, the contact region 15, and the contact layer 19. In this manner, when the contact region 15 is disposed in the front surface 21, the contact layer 19 may be disposed apart from the contact region 15.

Figure 4A:
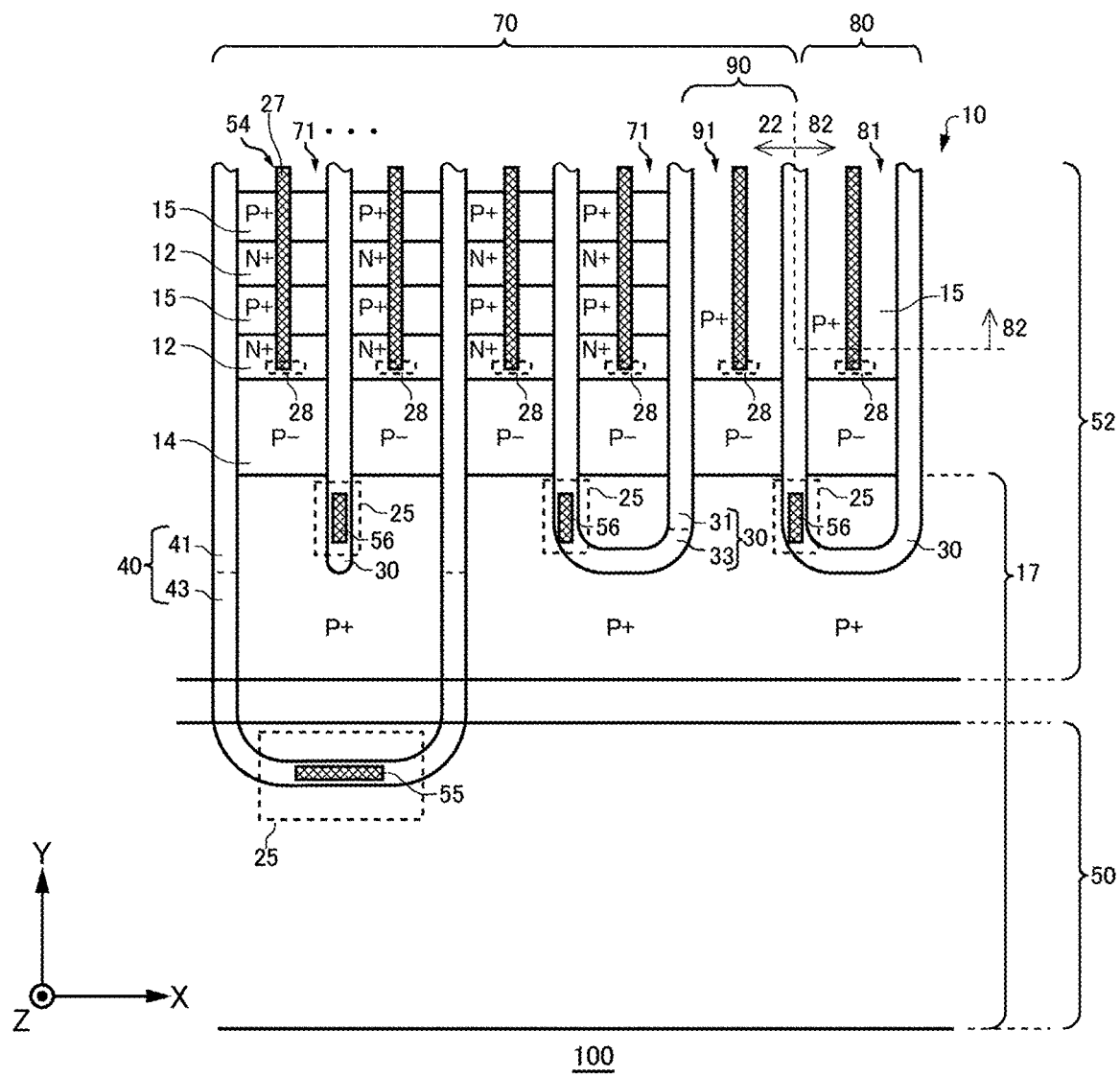
FIG. 4A illustrates an example of a plan view of the semiconductor device 100 according to an example.

FIG. 4A illustrates an example of a plan view of the semiconductor device 100 according to an example. The semiconductor device 100 of this example is different from that in the plan view of FIG. 1A in that the terminal ends 28 of the front surface 21 are disposed in the emitter regions 12. In this example, a difference from the plan view of FIG. 1A will be particularly described.

In each of the mesa portions 71, the base region 14 is disposed adjacent to the emitter region 12. At the front surface 21, the emitter regions 12 and the contact regions 15 are disposed alternately in the Y-axis direction. The terminal ends 28 of this example are disposed in regions where the emitter regions 12 are formed.

Figure 4B:
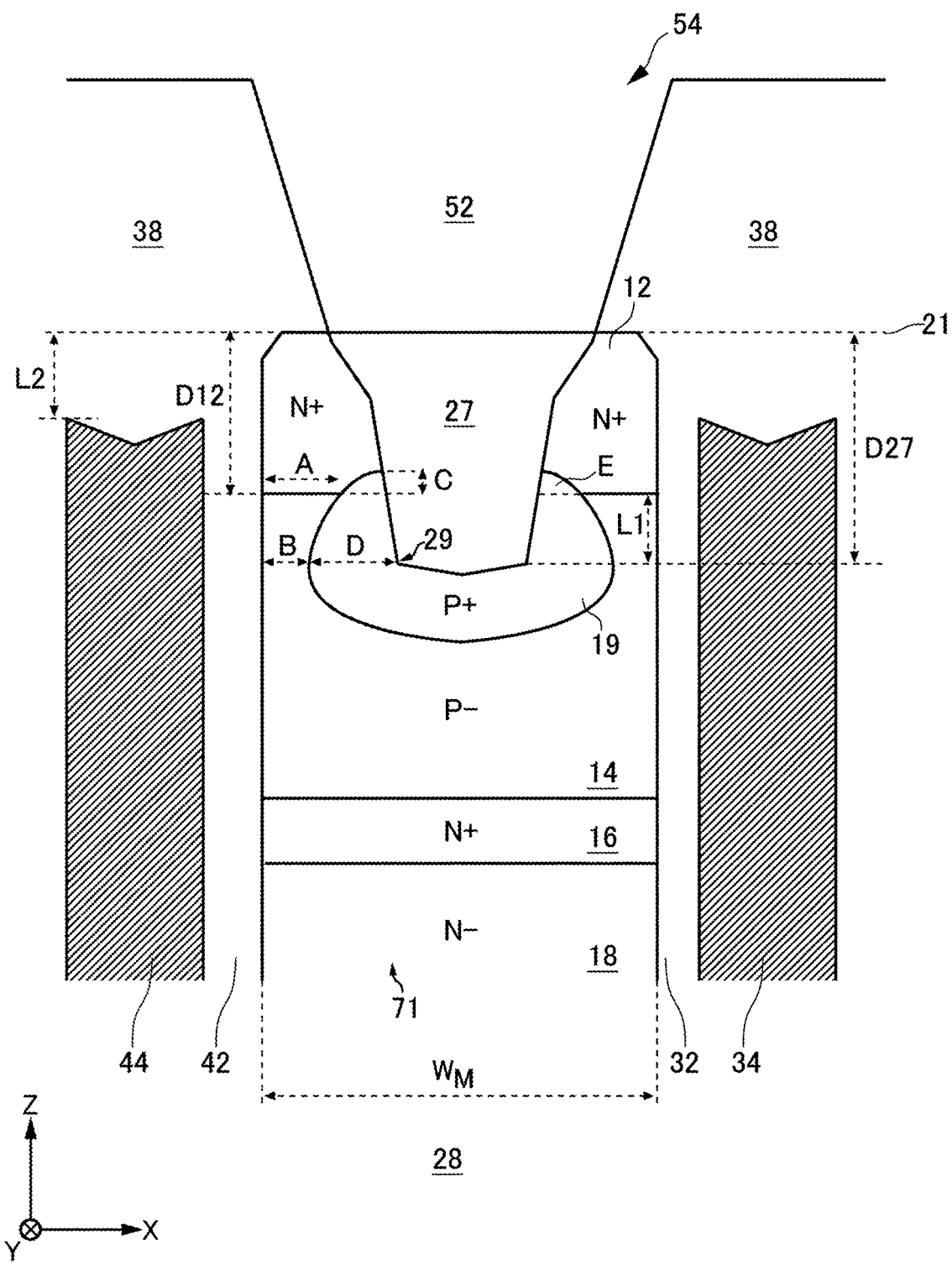
FIG. 4B illustrates an example of an enlarged cross-sectional view of the vicinity of the terminal end 28 in FIG. 4A.

FIG. 4B illustrates an example of an enlarged cross-sectional view of the vicinity of the terminal end 28 in FIG.

4A. This view illustrates an XZ plane passing through the terminal end 28. The semiconductor device 100 of this example is different from that in the cross-sectional view of FIG. 1F in that the emitter region 12 is disposed in the front surface 21 of the terminal end 28. In this example, a difference from the cross-sectional view of FIG. 1F will be particularly described.

The side wall of the terminal end 28 of the trench contact 27 is covered with the emitter region 12 and the contact layer 19. As illustrated in FIG. 4B, the contact layer 19 is disposed in contact with the emitter region 12.

Figure 5:
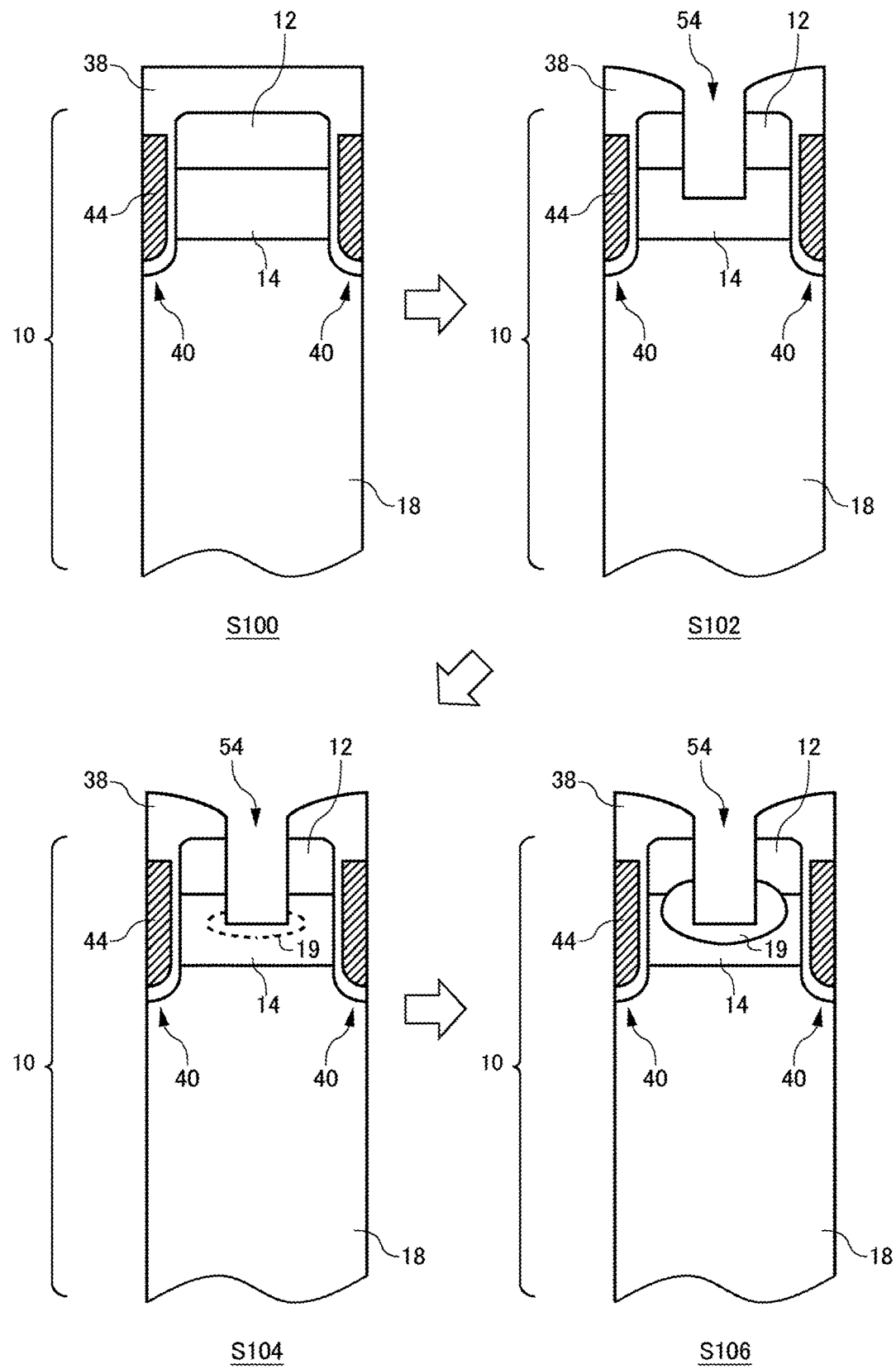
FIG. 5 illustrates an example of a fabrication method of a contact layer 19 of a single-tier configuration.

FIG. 5 illustrates an example of a fabrication method of the contact layer 19 of a single-tier configuration.

At step S100, the emitter region 12 and the base region 14 are formed in the semiconductor substrate 10. Further, the interlayer dielectric film 38 is formed on an upper surface of the emitter region 12 in the front surface 21.

At step S102, the contact hole 54 is formed by etching through the emitter region 12 to the base region 14. At this step, an oxide film mask is formed above the semiconductor substrate 10 by etching the interlayer dielectric film 38.

At step S104, using the interlayer dielectric film 38 as a mask, ion implantation is performed to form the contact layer 19. The dashed line indicates a region where a dopant for the contact layer 19 has been implanted.

At step S106, the contact layer 19 is formed by a heat treatment. The contact layer 19 may be disposed to extend into the emitter region 12 by the heat treatment. Thus, at the side wall of the trench contact 27, the emitter region 12 and the contact layer 19 come into contact with each other.

It is noted that in this example, after the contact hole 54 of the trench contact 27 is disposed, ion implantation is performed to form the contact layer 19. That is, because the dopant for the contact layer 19 is ion-implanted using the interlayer dielectric film 38 as the mask, alignment accuracy of the contact layer 19 with respect to the trench contact 27 is improved.

Figure 6:
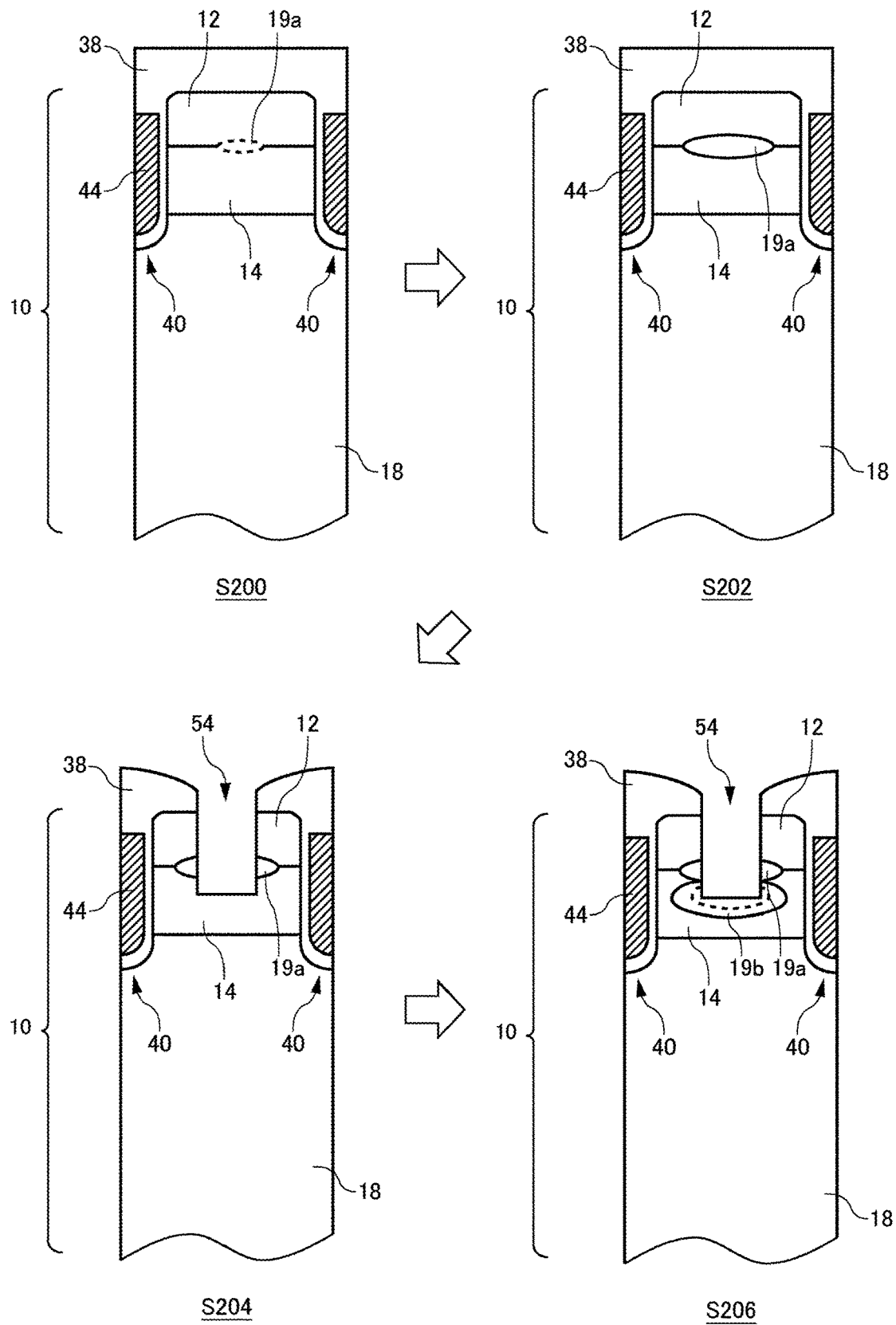
FIG. 6 illustrates an example of a fabrication method of the contact layer 19 of a double-tier configuration.

FIG. 6 illustrates an example of a fabrication method of the contact layer 19 of a double-tier configuration.

At step S200, a dopant for forming the contact layer 19a is implanted. The dashed line indicates a region where the dopant for the contact layer 19a has been implanted.

At step S202, the contact layer 19a is activated by a heat treatment. The heat treatment for activating the contact layer 19a may be omitted, and the contact layer 19a and the contact layer 19b may be collectively subjected to the heat treatment.

At step S204, the contact hole 54 is formed by etching through the emitter region 12 to the base region 14. Part of the contact layer 19a remains on a side wall of the contact hole 54.

At step S206, a dopant for forming the contact layer 19b is ion-implanted and subjected to a heat treatment. The contact layer 19b is formed under the contact layer 19a. The dashed line indicates a region where the dopant for the contact layer 19b has been implanted.

An implantation width of ion implantation for forming the contact layer 19a may be smaller than an implantation width of ion implantation for forming the contact layer 19b. Moreover, the doping concentration of the contact layer 19a may be lower than the doping concentration of the contact layer 19b. Thus, the contact layer 19b can be formed over a wider range than the contact layer 19a.

Figure 7:
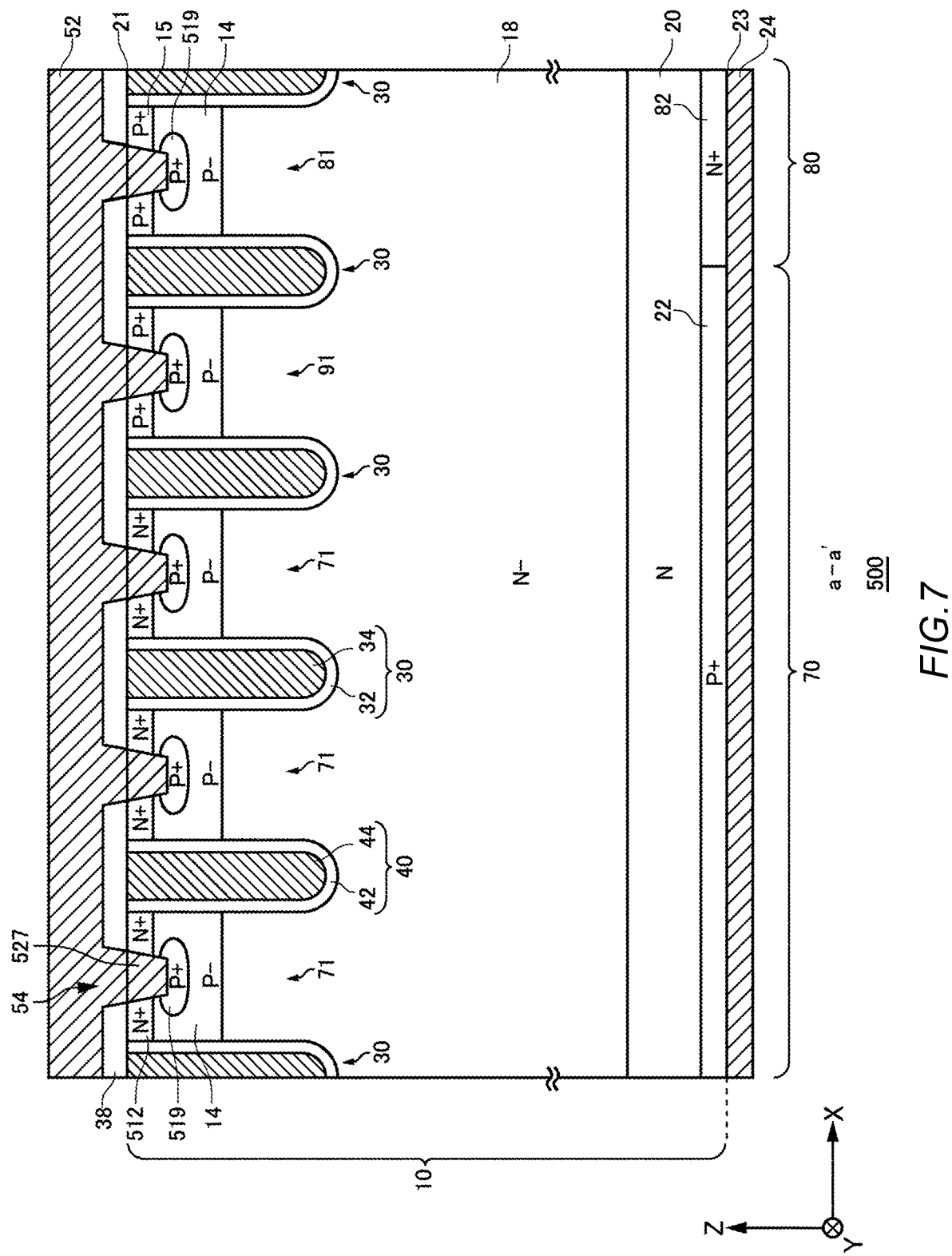
FIG. 7 illustrates a configuration of a semiconductor device 500 according to a comparative example.

FIG. 7 illustrates a configuration of a semiconductor device 500 according to a comparative example. In this example, a cross-sectional view corresponding to the a-a' cross section of FIG. 1A is illustrated.

On a side wall of each trench contact 527, a contact layer 519 is apart from an emitter region 512. Consequently, in the semiconductor device 500, it is difficult to prevent injection of carriers from the emitter region 512.

In contrast, in the semiconductor device 100, the contact layer 19 is in contact with the emitter region 12 so that injection of carriers from the emitter region 12 can be prevented to improve breaking withstand capability.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: contact region, 16: accumulation region, 17: well region, 18: drift region, 19: contact layer, 21: front surface, 22: collector region, 23: rear surface, 24: collector electrode, 25: connector, 27: trench contact, 28: terminal end, 29: side wall bottom, 30: dummy trench portion, 31: extending section, 32: dummy insulating film, 33: connecting section, 34: dummy conductor, 38: interlayer dielectric film, 40: gate trench portion, 41: extending section, 42: gate insulating film, 43: connecting section, 44: gate conductor, 50: gate metal layer, 52: emitter electrode, 54: contact hole, 55: contact hole, 56: contact hole, 70: transistor unit, 71: mesa portion, 80: diode unit, 81: mesa portion, 82: cathode region, 90: border part, 91: mesa portion, 100: semiconductor device, 500: semiconductor device, 512: emitter region, 519: contact layer, 527: trench contact

What is claimed is:

1. A semiconductor device comprising:
a drift region of a first conductivity type disposed in a semiconductor substrate;
a base region of a second conductivity type disposed above the drift region;
an emitter region of the first conductivity type disposed above the base region;
a plurality of trench portions arrayed in a predetermined array direction on a front surface side of the semiconductor substrate;
a trench contact disposed on the front surface side of the semiconductor substrate between two adjacent trench portions among the plurality of trench portions; and
a contact layer of the second conductivity type disposed under the trench contact and having a higher doping concentration than the base region,
wherein a lower end of the trench contact is deeper than a lower end of the emitter region, wherein the emitter region is exposed to a front surface of the semiconductor substrate at a side wall of the trench contact, wherein the emitter region and the contact layer are in contact with each other at the side wall of the trench contact, and wherein a shortest distance in the array direction between one trench portion of the two adjacent trench portions and an outer peripheral surface of the contact layer is smaller than a maximum distance from a side wall bottom of the trench contact, the side wall bottom being closest to the one trench portion in the array direction, to the outer peripheral surface of the contact layer on a side of the one trench portion in the array direction.

2. The semiconductor device according to claim 1, wherein in the array direction, a length of contact between the lower end of the emitter region and the base region is greater than a shortest distance between the contact layer and an adjacent trench portion among the plurality of trench portions.

3. The semiconductor device according to claim 1, wherein a shortest distance between the contact layer and an adjacent trench portion among the plurality of trench portions is equal to or greater than 0.1 μm.

4. The semiconductor device according to claim 1, wherein the contact layer comprises an extending region extending to the front surface side of the semiconductor substrate beyond the lower end of the emitter region.

5. The semiconductor device according to claim 1, wherein the trench contact comprises a bottom surface of a substantially planar shape.

6. The semiconductor device according to claim 1, wherein the trench contact comprises a concave bottom surface recessed to a rear surface side of the semiconductor substrate.

7. The semiconductor device according to claim 1, wherein the contact layer comprises
  a first contact layer disposed on the side wall of the trench contact, and
  a second contact layer disposed on the side wall of the trench contact and under the first contact layer.

8. The semiconductor device according to claim 7, wherein a doping concentration of the first contact layer is lower than a doping concentration of the second contact layer.

9. The semiconductor device according to claim 1,
wherein the trench contact is disposed to extend in an extending direction of the plurality of trench portions, and
wherein the contact layer is disposed on a side wall of a terminal end, which is an end of the trench contact in the extending direction.

10. The semiconductor device according to claim 9, wherein the side wall of the terminal end is covered with the emitter region and the contact layer.

11. The semiconductor device according to claim 9, wherein the side wall of the terminal end is covered with a region of the second conductivity type.

12. The semiconductor device according to claim 11, further comprising a contact region of the second conductivity type disposed in the front surface of the semiconductor substrate and having a higher doping concentration than the base region,
  wherein the side wall of the terminal end is covered with the contact region and the contact layer.

13. The semiconductor device according to claim 1, further comprising an accumulation region of the first conductivity type disposed on the semiconductor substrate front surface side of the drift region and having a higher doping concentration than the drift region.

14. A semiconductor device, comprising:
  a drift region of a first conductivity type disposed in a semiconductor substrate;
  a base region of a second conductivity type disposed above the drift region;
  an emitter region of the first conductivity type disposed above the base region;
  a plurality of trench portions arrayed in a predetermined array direction on a front surface side of the semiconductor substrate;
  a trench contact disposed on the front surface side of the semiconductor substrate between two adjacent trench portions among the plurality of trench portions; and
  a contact layer of the second conductivity type disposed under the trench contact and having a higher doping concentration than the base region,
  wherein a lower end of the trench contact is deeper than a lower end of the emitter region,
  wherein the emitter region is exposed to a front surface of the semiconductor substrate at a side wall of the trench contact,
  wherein the emitter region and the contact layer are in contact with each other at the side wall of the trench contact,
  wherein the contact layer comprises:
    a first contact layer disposed on the side wall of the trench contact; and
    a second contact layer disposed on the side wall of the trench contact and under the first contact layer, and
  wherein a shortest distance between the first contact layer and an adjacent trench portion among the plurality of trench portions is greater than a shortest distance between the second contact layer and an adjacent trench portion among the plurality of trench portions.

15. A semiconductor device comprising:
  a drift region of a first conductivity type disposed in a semiconductor substrate;
  a base region of a second conductivity type disposed above the drift region;
  an emitter region of the first conductivity type disposed above the base region;
  a plurality of trench portions arrayed in a predetermined array direction on a front surface side of the semiconductor substrate;
  a trench contact disposed on the front surface side of the semiconductor substrate between two adjacent trench portions among the plurality of trench portions;
  a contact layer of the second conductivity type disposed under the trench contact and having a higher doping concentration than the base region; and
  a contact region of the second conductivity type disposed in a front surface of the semiconductor substrate and having a higher doping concentration than the base region,
  wherein a lower end of the trench contact is deeper than a lower end of the emitter region,
  wherein the emitter region is exposed to the front surface of the semiconductor substrate at a side wall of the trench contact,
  wherein the emitter region and the contact layer are in contact with each other at the side wall of the trench contact,
  wherein the trench contact is disposed to extend in an extending direction of the plurality of trench portions, wherein the contact layer is disposed on a side wall of a terminal end, which is an end of the trench contact in the extending direction, and wherein the side wall of the terminal end is covered with the contact region, the base region, and the contact layer, all of which are of the second conductivity type.

\* \* \* \* \*